US008968673B2

(12) United States Patent
Agache et al.

(10) Patent No.: US 8,968,673 B2
(45) Date of Patent: Mar. 3, 2015

(54) METHOD FOR FUNCTIONALISING FLUID LINES CONTAINED IN A MICROMECHANICAL DEVICE, MICROMECHANICAL DEVICE INCLUDING FUNCTIONALISED LINES, AND METHOD FOR MANUFACTURING SAME

(75) Inventors: Vincent Agache, St Martin le Vinoux (FR); Antoine Hoang, Grenoble (FR); Françoise Vinet, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 123 days.

(21) Appl. No.: 13/805,491

(22) PCT Filed: Jun. 29, 2011

(86) PCT No.: PCT/IB2011/052865
§ 371 (c)(1),
(2), (4) Date: Feb. 7, 2013

(87) PCT Pub. No.: WO2012/001642
PCT Pub. Date: Jan. 5, 2012

(65) Prior Publication Data
US 2013/0149196 A1 Jun. 13, 2013

(30) Foreign Application Priority Data
Jun. 29, 2010 (FR) .................................... 10 02706

(51) Int. Cl.
*G01N 33/00* (2006.01)
*G03F 7/24* (2006.01)
*B81C 1/00* (2006.01)
*F04B 19/00* (2006.01)

(52) U.S. Cl.
CPC .............. *G03F 7/24* (2013.01); *B81C 1/00206* (2013.01); *F04B 19/006* (2013.01); *B81B 2201/0214* (2013.01); *B81B 2201/058* (2013.01); *B81B 2201/06* (2013.01); *B81C 2201/0154* (2013.01)
USPC ............................. 422/400; 422/502; 422/503

(58) Field of Classification Search
USPC ........................................ 422/502, 503, 400
See application file for complete search history.

(56) References Cited

U.S. PATENT DOCUMENTS 7,148,058 B2 * 12/2006 Charych et al. ............ 435/287.8
7,846,875 B2    12/2010 Hoang et al.
(Continued)

FOREIGN PATENT DOCUMENTS

EP      0969083      1/2000
FR      2931549      11/2009
(Continued)

OTHER PUBLICATIONS

Written Opinion for International Application No. PCT?IB2011/052865; dated Jun. 29, 2011.

*Primary Examiner* — Sam P Siefke
(74) *Attorney, Agent, or Firm* — Alston & Bird LLP

(57) ABSTRACT

The present invention relates to a method for functionalizing fluid lines (1b) in a micromechanical device, the walls of which include an opaque layer. For this purpose, the invention provides a method for functionalizing a micromechanical device provided with a fluid line including a peripheral wall (5) having a surface (2) outside the line and an inner surface (3) defining a space (1b) in which a fluid can circulate, the peripheral wall at least partially including a silicon layer (5a). The method includes the following steps: a) providing a device, the peripheral wall (5) of which at least partially includes a silicon layer (5a) having, at least locally, a thickness (e) of more than 100 nm and less than 200 nm, advantageously of 160 to 180 nm; c) silanizing at least the inner surface of the fluid line; d) the localized, selective photo-deprotection on at least the inner surface of the silanized device by exposing the peripheral wall (5) at the point at which said wall has a thickness (e) of more than 100 nm and less than 200 nm, advantageously of 160 to 180 nm.

32 Claims, 8 Drawing Sheets

(56) References Cited

U.S. PATENT DOCUMENTS

| | | |
|---|---|---|
| 2003/0032035 A1 | 2/2003 | Chatelain et al. |
| 2003/0219196 A1 | 11/2003 | Weng et al. |
| 2011/0138891 A1 | 6/2011 | Agache et al. |
| 2011/0167908 A1 | 7/2011 | Agache |

FOREIGN PATENT DOCUMENTS

| | | |
|---|---|---|
| WO | WO-2006/024722 | 3/2006 |
| WO | WO-2008/097370 | 8/2008 |
| WO | WO-2009/141515 | 11/2009 |

* cited by examiner

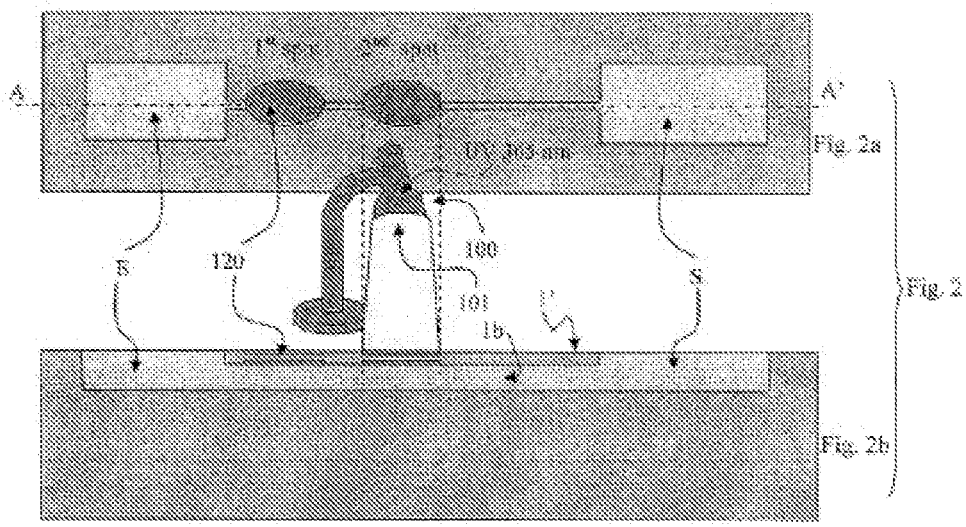
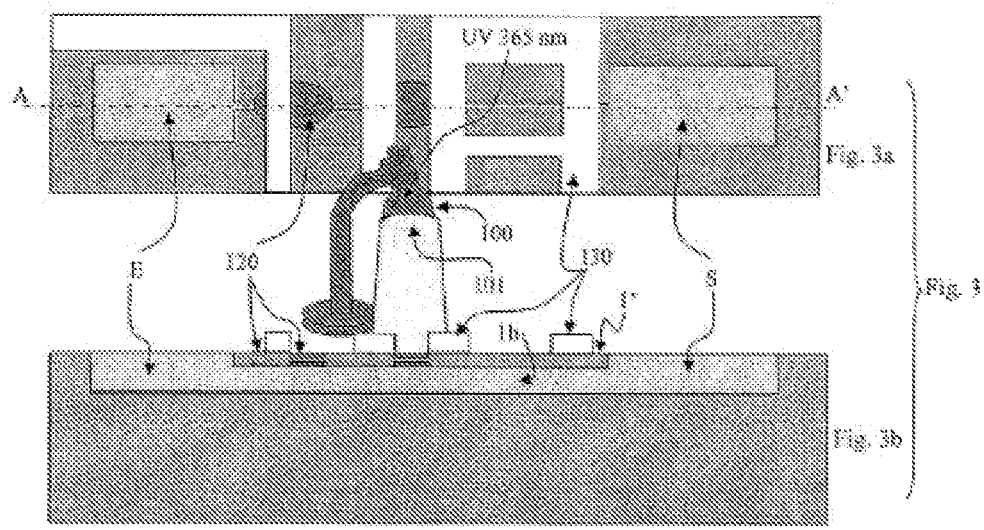

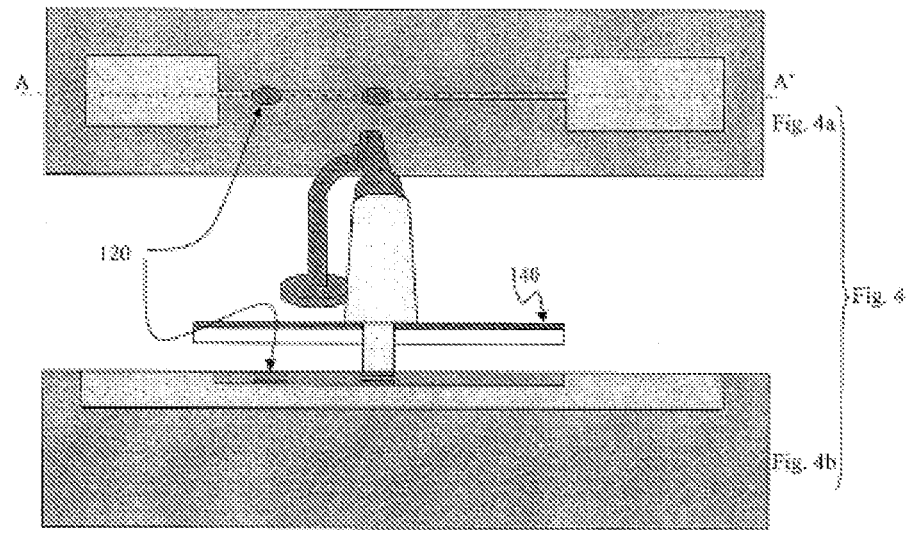
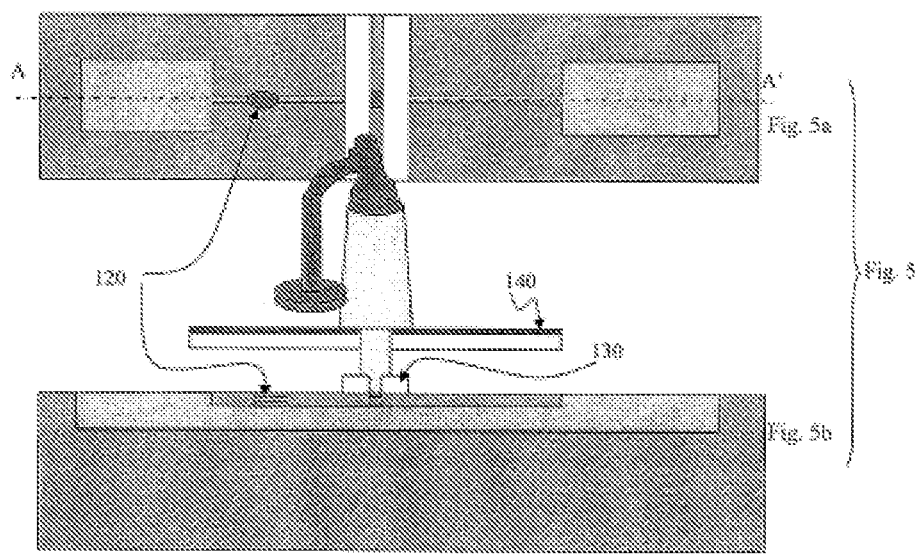

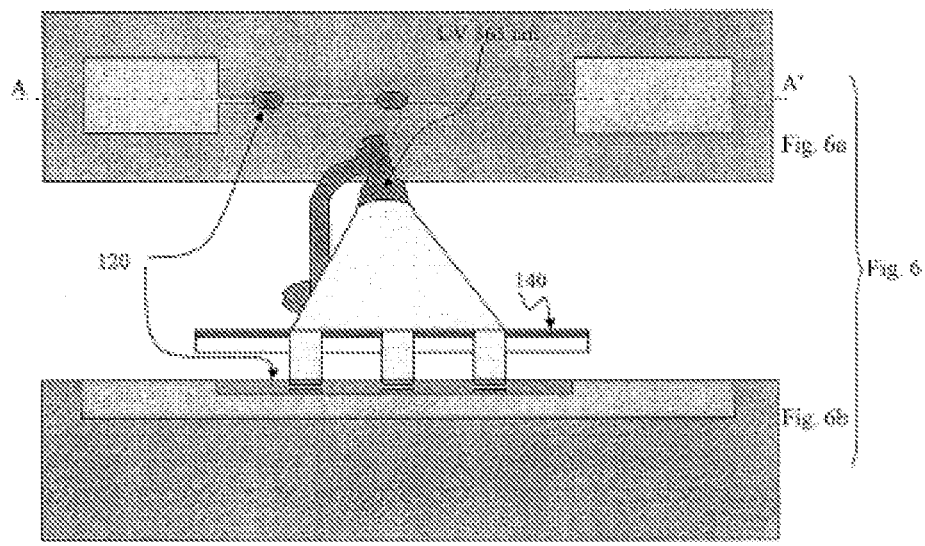
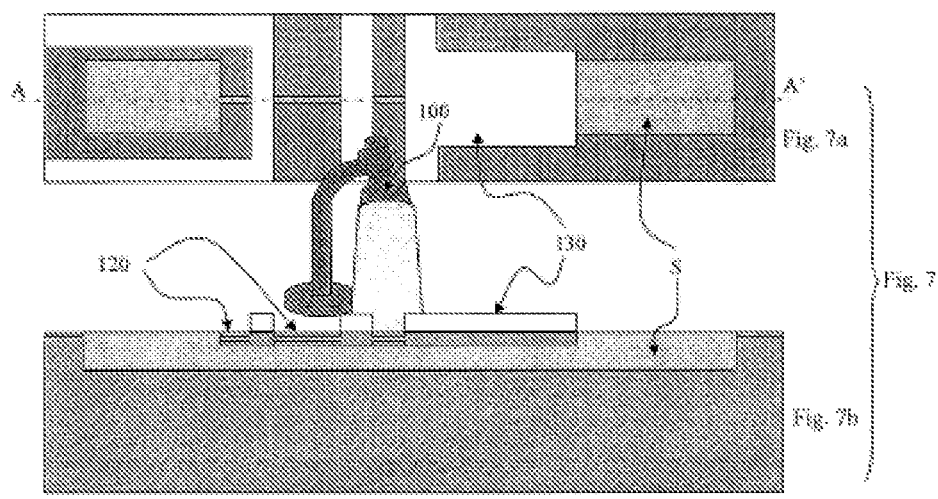

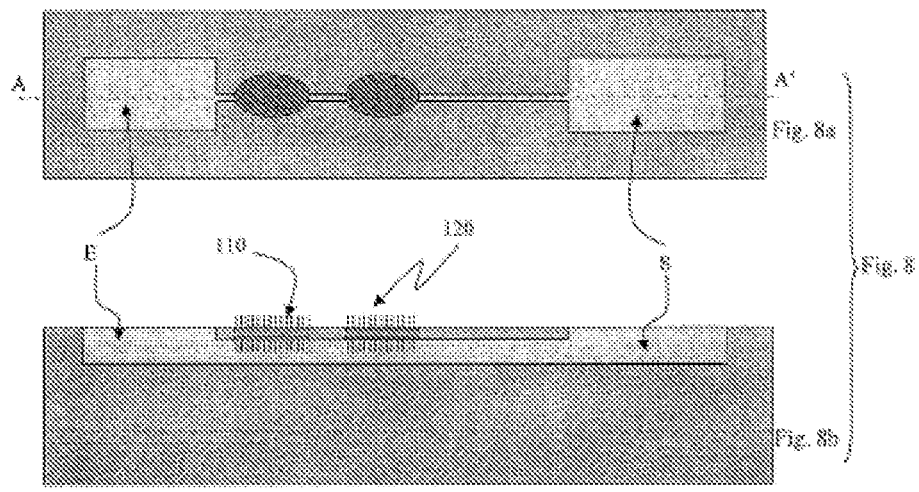
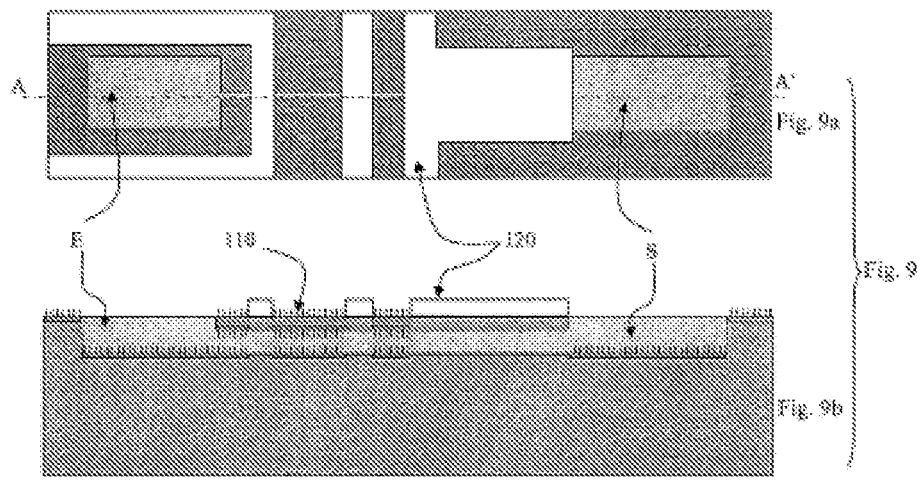

METHOD FOR FUNCTIONALISING FLUID LINES CONTAINED IN A MICROMECHANICAL DEVICE, MICROMECHANICAL DEVICE INCLUDING FUNCTIONALISED LINES, AND METHOD FOR MANUFACTURING SAME

FIELD

The present invention relates to a method for functionalizing one or more fluid lines covered with an opaque wall, for example made of silicon. It also relates to devices containing fluid lines which can be functionalized and also to their production method.

BACKGROUND

In the description below, the expression "fluid line" should be understood to mean any tubular structure comprising a peripheral wall laterally delimiting a space in which a fluid can circulate, and comprising an inlet and an outlet. The transversal section of a fluid line can be of any form (circular, polygonal, etc.), constant or not along the line. A capillary tube, a duct, a pipeline are all synonyms of the concept of fluid line as used in the invention.

The functionalization of a surface is the operation by which one or more molecule(s) of interest are fastened onto a surface, so that it/they retains/retain all or part of its/their properties. The functionalization of a surface therefore presupposes that both the molecule of interest and an associated method for fastening it onto the surface are available.

Several types of surface functionalization methods are known from the prior art. Traditionally, they consist in modifying the surface to be functionalized through chemical reactions aiming to generate functions which can be reactivated with regard to a probe molecule. Said probe molecule then being used to pick up a target whose presence is ultimately to be detected.

The main difficulties encountered in these surface functionalizations lie in the choice of reactive chemical functions that can be implemented to obtain the immobilization of the probe on the surface of a support. For example, the chemical nature of the surface of the support has to be taken into account.

In the case of a silicon substrate, the molecules of silane type are widely used. A molecule is then employed which exhibits a silane function which can react with the support made of silicon via the surface silanols and a reactive function that may or may not be masked with respect to a probe molecule, possibly chemically modified. Once the silane is fixed on the surface of the support, the probe molecule is positioned on the silane molecule by the use of complementary reactive functions.

To delimit on a support, made of silicon for example, the areas which will have to undergo a functionalization, use is conventionally made of the techniques of localized reactions by automaton (or "spotting") that make it possible to accurately locate the ejection of the silane and, consequently, to define successive and isolated areas that are functionalized by silanes of different natures.

Nevertheless, this technique cannot be considered in the case where the surface of the support is made inaccessible to the spotting. In particular, in the case where the aim is to discretize the areas of a surface situated on the internal face of a sealed cavity.

Using this assumption, provision can be made, for example, to locally modify the wettability of the surface of the support prior to its placement in a more complex device in order to subsequently preferentially guide the reagents including the silanes to the modified areas of wettability. Also, it is possible to modify the surface of the support via the introduction of metallic contacts which are electrically connected and can be used for electrografting.

However, the abovementioned techniques require significant modifications to the structure of the surface, adding to the complexity of the production of micromechanical devices that are already sufficiently complex.

There are also silanes that have a function masked by a photolabile grouping. After fixing onto the surface of a support, said silanes are deprotected to release a function which is itself reactive with respect to a complementary function borne by a probe molecule. By the use of a selective insolation, the photodeprotection can be localized and make it possible to differentiate areas on the surface of the support.

From the use of this type of silane, the need to render the surface accessible to the insolation conditions will be understood, which consequently poses a problem when the surface to be functionalized selectively forms part of a closed cavity whose walls are opaque, for example made of silicon or of another opaque material.

Most of the methods of functionalization through photochemical means that are known are applied to the functionalization of a planar surface, directly lit for the photochemical reaction. Since the lighting of the surface is direct, the nature of the support is involved only in the chemical reaction itself, and not in the possibility of activating it by lighting. The supports used can therefore be made of plastic, of glass, of silicon, or any other opaque material.

SUMMARY

The functionalization of the interior of a closed cavity (such as a fluid line), or of tubular supports in the form of capillary tubes or of channels, necessarily entails the use of a material that is transparent to lighting. In practice, to light the internal surface of the fluid lines, the light has to pass through the wall, which constitutes indirect lighting of the surface.

A method for functionalizing substrates that have, among others, the form of capillary tubes, has been described in the document WO 2006/024722. The functionalization of the capillary tubes was produced by deprotecting reactive functions of a compound by insolation using an ultraviolet lamp, then bringing the activated surface of the capillary tubes into contact with a solution of the biological molecules of interest. The duly activated capillary tubes are necessarily made of glass and are transparent to UV light.

To sum up, the standard functionalization techniques cannot therefore be considered for locally grafting a molecule of interest (for example a probe) inside a closed cavity, and in particular inside a fluid line covered with a layer of silicon or other opaque materials, as can be encountered in micromechanical devices. Such devices are known, for example, from the document FR 2 931 549.

There is therefore a need to propose an effective method that makes it possible to functionalize a fluid line or a channel that has walls comprising at least one opaque layer, that is to say, in the present invention, a layer that is not transparent to the photodeprotection light (generally ultraviolet light) that may or may not be contained in a device such as the one described in the application FR 2 931 549.

The aim of the present invention is therefore to provide a method for functionalizing fluid lines whose walls comprise an opaque layer.

The subject of the invention is therefore a method for functionalizing a micromechanical device provided with a fluid line comprising a peripheral wall having a surface external to the line and an internal surface delimiting a space in which a fluid can circulate, the peripheral wall comprising at least partially a layer of silicon, characterized in that it comprises the following steps:
- a) the provision of a device whose peripheral wall at least partially comprises a layer of silicon having, at least locally, a thickness of between 100 and 200 nm exclusive, advantageously between 160 and 180 nm,
- c) the silanization of at least the internal surface of the fluid line,
- d) the localized and selective photodeprotection on at least the internal surface of the silanized device by insolation of the peripheral wall at the point where it has a thickness of between 100 and 200 nm exclusive, advantageously between 160 and 180 nm.

By convention, the steps are performed in alphabetical order.

Advantageously, the method may comprise a step b) of hydration of at least the internal surface of the fluid line.

Advantageously, the device is a micromechanical device, such as, for example, a resonator used as gravimetric sensor.

According to particular features of the method of the invention, before the step of silanization, the internal surface of the fluid line is hydrated. The hydration step may comprise the immersion of the device in a solution based on alcohol and on metal hydroxide or an alcoholic acid solution.

According to another development of the invention, before the silanization, the internal surface of the fluid line is treated by an oxygen plasma.

According to a particular feature of the invention, the silanization step may comprise the immersion of the device in a solution containing photosensitive silanes. The silane used in the silanization step may be a photosensitive oxyamine silane.

According to the invention, the expression "photosensitive silane" should be understood to mean a molecule of silane type comprising a silanized grouping capable of reacting with a surface of silicon type and a photolabile grouping protecting a reactive function with a view to the grafting of a probe molecule.

According to other particular features of the method of the invention:
- the insolation can be produced by a UV light lamp. Preferably, this lamp has a power of 100 W and an intensity of 20 to 25 mW/cm$^2$, preferably of the order of 24 mW/cm$^2$;
- the insolation can be performed sequentially or simultaneously;
- the insolation time is generally between 5 and 30 seconds;
- the sequential insolation can be produced with a UV light ray which passes through a mechanical aperture of adjustable width;
- the sequential or simultaneous insolation can be produced on a device covered with a layer of patterns that are opaque to the silane irradiation wavelengths;
- the sequential or simultaneous insolation can be produced by using a quartz photolithography mask comprising micronic patterns capable of filtering UV light;
- the sequential or simultaneous insolation can be produced by using a photolithography mask combined with a masking of opaque patterns;
- the insolation can be produced simultaneously as a solid plate through a photolithography mask or through opaque patterns.

According to another embodiment, the method of the present invention may also comprise a step of grafting at least one molecule onto the silanes that are fixed on at least one surface of a fluid line by the implementation of a pair of chemical functions borne by the molecule to be grafted and the silanes. In other words, the deprotected silane can react with a probe molecule, chemically modified or not, to immobilize said probe molecule on the internal surface of the fluid line.

According to yet other features of the method of the invention;
- the molecules to be grafted may be macromolecules, chosen from nucleic acids, lipids and/or proteins;
- the molecules to be grafted may be probes of oligonucleotide type.

According to yet another embodiment, the method of the present invention may also comprise a hybridation step, followed by a fluorescence-mode reading step.

According to yet another embodiment, the method of the present invention may also comprise a hybridation step, followed by a step of detection and/or characterization of the hybridation. In particular, this detection step can be done using electrical means.

Another aim of the present invention is to provide a micromechanical device containing fluid lines whose wall comprises, at least partially, a layer of opaque materials and which can be functionalized by the method of the invention.

Another subject of the present invention is therefore the provision of a micromechanical device that can be functionalized by the method of the invention, the device being provided with a fluid line comprising a peripheral wall having a surface external to the line and an internal surface delimiting a space in which a fluid can circulate, the peripheral wall at least partially comprising a layer of silicon, the device having, at least locally, a thickness of between 100 and 200 nm exclusive, preferably between 160 and 180 nm, and the internal surface being silanized.

According to other features of the device:
- the silanized internal surface may be at least locally deprotected at the point where the thickness of the wall is between 100 and 200 nm exclusive, preferably between 160 and 180 nm;
- the locally deprotected silanized internal surface may comprise grafted molecules;
- the grafted molecules may be probes. The term "probe" should be understood to mean molecules which are suitable for detecting specific targets.

According to a particular embodiment, the device of the present invention may be a device for the gravimetric detection of particles in a fluid medium, comprising a planar electromechanical oscillator, oscillator support means and means for actuating said oscillator, said means being arranged to ensure the vibration of the oscillator, said device also comprising a channel for the passage of the fluid, the electromechanical oscillator comprising a through fluid line fluidically connected upstream and downstream to said channel, the line having an internal surface delimiting a space in which a fluid can circulate, and being delimited at least partially by a peripheral wall comprising a layer of silicon having, at least locally, a thickness of between 100 and 200 nm exclusive, preferably between 160 and 180 nm, the internal surface being silanized.

According to particular features of the device:
- the silanized internal surface may be at least locally deprotected at the point where the thickness of the wall is between 100 and 200 nm exclusive, preferably between 160 and 180 nm;

the locally deprotected silanized internal surface may comprise molecules grafted by bringing said molecules into contact with the photodeprotected function of the silane;

the grafted molecules may be probes;

the electromechanical oscillator may have a form taken from a disk, a ring and a polygon, preferably a square;

the oscillator may be of square form and has a width and a thickness such that the ratio of the width to the thickness is between 10 and 30, preferably 10;

the electromechanical oscillator may be obtained from a layer of substrate made of polycrystalline material;

the electromechanical oscillator may be obtained preferentially from a substrate made of monocrystalline material;

the substrate may be silicon-based;

the electromechanical oscillator may comprise, or be obtained from, metals deposited by the VPD (vapor-phase deposition), evaporation or electrolytic growth method;

the through fluid line of the oscillator and/or the channel contains pillars whose transversal section is of a form taken from a circle, an ellipse and a polygon.

the peripheral wall comprising the layer of silicon may comprise a metallic material with a view to a detection by transduction (piezometallic, capacitive, thermoelastic), possibly in track form. Advantageously, said metallic material may have a mask function for the photodeprotection and a detection function in the context of the invention.

The present invention also relates to a method for producing a device according to the invention, comprising the following steps:

the selection of a substrate that is appropriate for the gravimetric detection envisaged, comprising, at least partially, a layer of silicon, the production from said substrate of an electromechanical oscillator that is planar and at least partially comprises the layer of silicon, the production of a fluid line in said oscillator, such that the wall at least partially comprising the layer of silicon has, at least locally, a thickness of between 100 and 200 nm exclusive, preferably between 160 and 180 nm, the production of a channel for the passage of the fluid, said channel being fluidically connected to said fluid line formed in the oscillator, the silanization of at least the internal surface of the fluid line.

The present invention also relates to the use of a method for functionalization by photochemistry with a device provided with at least one fluid line having a wall that is at least partially opaque to the wavelengths used by the insolation to activate the photochemical reaction, in which the device is provided with a fluid line of which a peripheral wall at least partially comprises a layer of silicon having, at least locally, a thickness of between 100 and 200 nm exclusively, preferably between 160 and 180 nm.

BRIEF DESCRIPTION OF THE DRAWINGS

Other features of the invention will be cited in the following detailed description given with reference to the figures which respectively represent:

FIG. 2, a schematic cross-sectional view (FIG. 2b) and plan view (FIG. 2a) of a device similar to that of FIG. 1 in a sequential insolation;

FIG. 3, a schematic cross-sectional view (FIG. 3b) and plan view (FIG. 3a) of a device similar to that of FIG. 1 in a sequential insolation with a mask of opaque patterns;

FIG. 4, a schematic cross-sectional view (FIG. 4b) and plan view (FIG. 4a) of a device similar to that of FIG. 1 in a sequential insolation with a photolithography mask;

FIG. 5, a schematic cross-sectional view (FIG. 5b) and plan view (FIG. 5a) of a device similar to that of FIG. 1 in a sequential insolation with a photolithography mask combined with the mask of opaque patterns;

FIG. 6, a schematic cross-sectional view (FIG. 6b) and plan view (FIG. 6a) of a device similar to that of FIG. 1 in a simultaneous insolation as a solid plate with a photolithography mask;

FIG. 7, a schematic cross-sectional view (FIG. 7b) and plan view (FIG. 7a) of a device similar to that of FIG. 1 in a simultaneous insolation as a solid plate with a mask of opaque patterns;

FIG. 8, a schematic cross-sectional view (FIG. 8b) and plan view (FIG. 8a) of a device similar to that of FIG. 1 during the probe fixing step after a sequential insolation;

FIG. 9, a schematic cross-sectional view (FIG. 9b) and plan view (FIG. 9a) of a device similar to that of FIG. 1 during the probe fixing step after a sequential insolation with the mask of opaque patterns;

DETAILED DESCRIPTION

Figure 1:
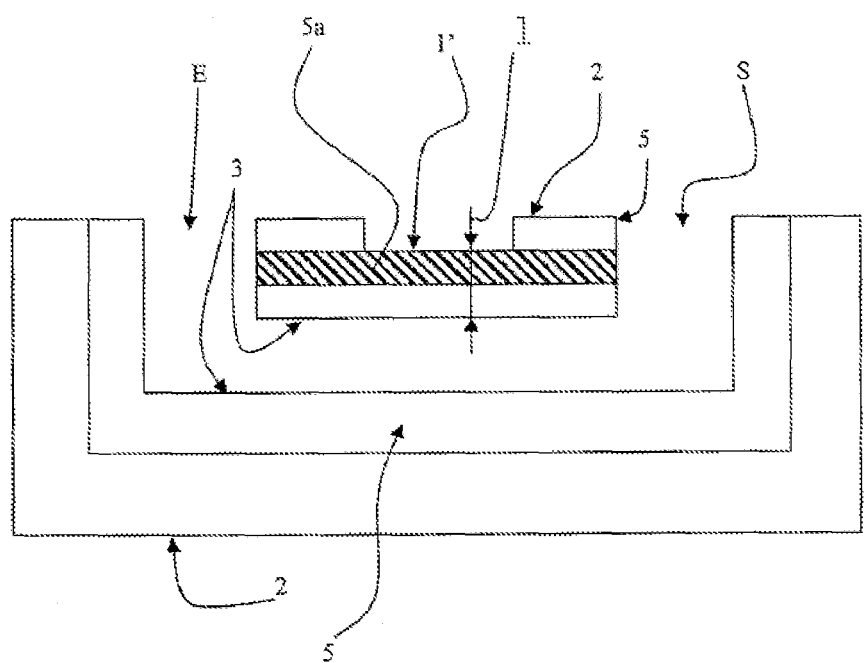
FIG. 1, a schematic cross-sectional view of a portion of a device comprising a fluid line which can be functionalized according to the method of the invention.

The functionalization method according to the invention is useful for the functionalization of a micromechanical device such as that presented in FIG. 1. This device is provided with at least one fluid line 1b comprising a peripheral wall 5 having a surface 2 external to the line and an internal surface 3 delimiting a space in which a fluid can circulate. The peripheral wall 5 comprises, at least partially, a layer of silicon 5a, having, at least locally, a thickness e of between 100 and 200 nm exclusive, preferably between 160 and 180 nm.

The functionalization method according to the invention comprises a first step of provision of a device as presented in FIG. 1, followed by a step of hydration of at least one surface of the fluid line of the device.

The hydration step comprises the immersion of the device provided with the fluid lines 1 in a solution which penetrates into the lines through fluid ports E and S. This solution is an aqueous or alcohol-aqueous solution with a basic or acid pH. Among these, it is possible to cite the solution based on ethanol and on sodium hydroxide (1 g NaOH, 4 mL H2O, 3 mL EtOH). The device is left in the solution for one hour and then it is washed with pure water, and dried in nitrogen. Alternatively, an O2 plasma can be employed.

The duly hydrated device is subjected to a silanization step.

The silanization step comprises the immersion of the device in a solution containing 10 mM of photosensitive silane which penetrates and "mats" the interior of the channels through the fluid ports. The device is immersed in a solution containing trichlorethylene, and incubated for a period of 6 to 48 hours, on average of the order of 12 hours at ambient temperature. After washing in the silanization solvent (trichloroethylene for example), then ethanol, the device is dried under nitrogen.

At this stage, the silane covers all the surfaces of the device, unless protection areas are formed on these surfaces by means of a material preventing the silanization.

The silane used is a photosensitive oxyamine silane, the synthesis and formulation of which is described below:

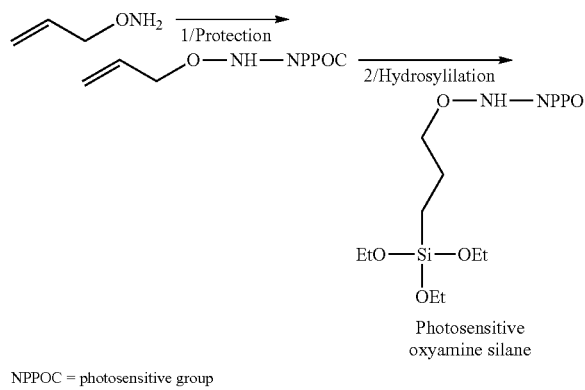

NPPOC = photosensitive group

Obviously, the person skilled in the art will be able to use any photosensitive oxyamine silane as described for example in the document WO 2006/024722, the content of which is incorporated by reference.

Next, the silanized device is subjected to a photodeprotection step.

This photodeprotection step comprises bringing at least one surface of the device into contact with a 5% aqueous solution of pyridine or a 20 mM aqueous solution of soda. Preferably, this solution is contained in the fluid line to prevent or limit its evaporation. For example, this containment is obtained by blocking the ports E and S. The device is thus mounted on the plate of a microscope, equipped with a mercury lamp 100 preferably having a power of 100 W and an intensity of between 20 and 25 mW/cm$^2$, preferably 24 mW/cm$^2$.

The purpose of the lamp 100 is to irradiate the layer of silane and in particular that contained in the fluid lines 1b. To this end, the thickness of the wall comprising the layer of silicon covering the fluid line is sufficiently thin (in this case between 100 and 200 nm exclusive, preferably between 160 and 180 nm), and judiciously chosen to enable the transmission of a portion of light ray so that sufficient insolation energy passes through this portion of the wall.

Figure 14:
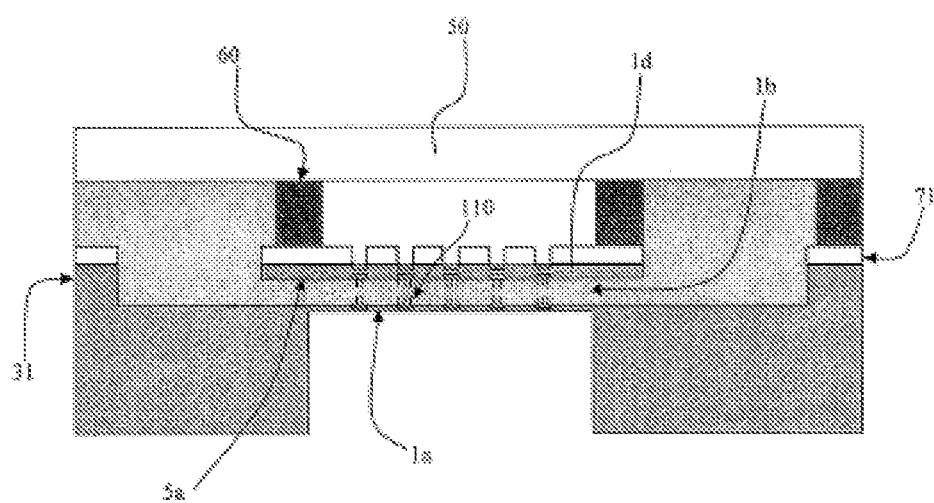
FIG. 14, a schematic cross-sectional view of an exemplary embodiment of a device according to the invention comprising a structured metallic layer on the layer of silicon of the fluid line.

The irradiation of the silane results in the deprotection and the activation of the function that this silane includes, and which is intended to fix a probe 110 (see FIG. 14).

A number of insolation methods are possible, as well as the desired size of the active areas 120 (areas where the probes will be immobilized), the number of sites to be insolated, the location accuracy of the same sites relative to the geometry of the lines.

The insolation methods used in the functionalization method according to the present invention are chosen from sequential insolation and simultaneous insolation as a solid plate.

FIG. 2 illustrates the device of the invention in a sequential insolation. During this insolation, the fluid line 1b where the probes are to be grafted is insolated sequentially by a UV flash 100 which is emitted and whose beam passes freely through a mechanical aperture 101 of adjustable width (diaphragm+ shutter). This flash occurs after the displacement of the plateau on which the device rests. The size of the insolated spots 120 depends on the width of the mechanical aperture, and is advantageously of the order of 100 μm in diameter but can be reduced more if necessary. The size of the spots can vary from one side to another, and, where appropriate, will entail the adjustment of the aperture of the flash diaphragm.

FIG. 3 illustrates the device of the invention during a sequential insolation with a mask of opaque patterns 130. These patterns are defined in a material that is opaque to the irradiation wavelengths of the silane. This mask 130 locally covers the wall 1' having a thickness of between 100 and 200 nm exclusive, preferably between 160 and 180 nm, and comprising the layer of silicon. This mask 130 is structured by thin film deposition and chemical or dry etching techniques. Its purpose, for example, is to arrange patterns of chromium, gold, or other material on the wall 1'. The only condition is that the mask material be opaque to the irradiation wavelengths of the silane and that its thickness prevent any transmission of silane deprotection UV energy. This material may also cover functions of an electrical nature (for example, electrodes for concentration by DEP, piezometallic detection electrodes, etc.). In the case of the use of a material forming a mask of metallic nature, it is desirable to produce the metallic deposition on a surface of passivated silicon with an insulator, for example, of silica obtained by heat oxidation.

Also, this mask 130 of an opaque material can, in a preferential version, have chemical surface properties which prevent local silanization.

FIG. 4 illustrates a device according to the invention in a sequential insolation with a photolithography mask 140. The sequential insolation can be done using the UV lamp 100 alone or by coupling this lamp and the microscope with the use of a photolithography mask 140 made of quartz covered with patterns made of chromium 141, of micronic size (of the order of a micron or more), or even submicronic size, which thus filter the UV light. The microscope is equipped with a mask-holder that is affixed and aligned above the sample support (reprising the same principle as that of photolithography in conventional microelectronics methods). Between each UV flash, the mask-holder is displaced on X, Y (in the manner of a "stepper" or photorepeater) by a value which depends on the placement of the sites to be insolated in the fluid line.

The latter method can be coupled with the use of structured opaque masks 130 on the device (FIG. 3) which would have a size or a spacing smaller than the patterns of the photolithography mask. Such a combination is presented in FIG. 5.

The two advantages of such a combination are the use of masks 130 of low resolution which is less costly, and the reduction in the surface area by the opaque patterns. In practice, in the case of sensors or a portion of the peripheral wall 5 may be set to vibrate (see FIGS. 10 to 14), the presence of said patterns may generate a degradation of the resonance frequency (and therefore a drop in sensitivity) because they make the wall heavier. Furthermore, this makes it possible to retain only the patterns that fulfill a function of electrical, mechanical, chemical nature specific to the device. For example, the opaque layer, when it is a metal (for example gold, AlSi, chromium, nickel, tungsten, etc.) can serve as a piezometallic track to produce a piezometallic detection associated with the gravimetric sensor, rather than a capacitive detection for example. In this case, it is necessary to structure a metallic layer above the wall of the gravimetric sensor.

As is presented in FIG. 6, the insolation can be done simultaneously over the entire surface that is to be functionalized. This insolation is said to be "solid plate". The solid plate insolation is done through a photolithography mask 140. For this technique, the aim is to insolate a number of sites at once, through a photolithography mask aligned relative to the position of the line 1b and of the patterns 120 that the latter has to include.

By reprising the abovementioned method, in a preferential embodiment illustrated in FIG. 7, patterns 130 are deposited and structured in a material that is opaque to the irradiation wavelengths of the silane. This material (chromium, gold, or other material) being directly incorporated on the device and locally covers the wall 1' provided with the layer of silicon 5a and having a thickness between 100 and 200 nm exclusive, preferably between 160 and 180 nm. The whole of the plate is insolated at once allowing for the deprotection of the silanes 120 which are not situated below the opaque patterns deposited on the wall of the fluid line.

Solid plate insolation makes it possible to insolate the device in one go, in order to irradiate all of the area of interest collectively, and not use multiple insolations of the silane, as is the case for sequential insolation. This method is therefore faster.

After UV insolation, during the grafting step, the device is rinsed with water is brought into contact with an aqueous solution containing the molecule to be grafted. The specific-reaction grafting methods are preferred, which means that the immobilization of the probe 110 on the deprotected silanes implements a pair of chemical functions that are borne on the probe 110 and the deprotected silane is fixed on the surface of the fluid line. This notion of pair of chemical functions is based on the reactivity between a nucleophile and an electrophile for example. The grafting takes place only at the points where the silane, covering the device, has been previously irradiated and therefore deprotected. In the case of a biological recognition model of the hybridation type, the immobilization consequently establishes links of covalent type between the deposited probe 110 (sequence of oligonucleotides with associated chemical function) and the irradiated silane. The grafting of oligonucleotides is performed by immersion of the device in a solution of oxidized sodium periodate containing the oligonucleotides to be fixed (comprise vicinal diol functions at the ends 3' or 5' or comprise a ribose at 3') at 20 µM, for 15 minutes at ambient temperature. The device is then rinsed with water then dried under a stream of nitrogen.

FIGS. 8 and 9 respectively illustrate a device according to the invention during the step of fixing a probe inside the fluid line after a sequential insolation with a photolithography mask 140 (not represented) or after a sequential insolation with the mask 130 of opaque patterns.

After the step of fixing the oligonucleotide probes, the method according to the invention comprises a subsequent hybridation step.

During this step, the device is brought into contact with a solution containing the targets (for example complementary sequences of oligonucleotides) present in a 100 nM equivalent concentration, that are marked using a fluorophore Cy3®. The immersion time of the device is one hour at 39° C. The device is then rinsed in a buffer solution: 2×SSC (Sigma Aldrich).

This hybration step is followed by a fluorescence mode reading step. For example, it is possible to use a scanner of GeneTAC™ LS IV brand, genomic solutions (Cy3 emission wavelength: 570 nm: Cy3 excitation wavelength: 550 nm).

It is important to specify that, for all the steps of immersion of the device, the liquid can penetrate freely into the fluid lines through the fluid ports E and S.

Figure 10:
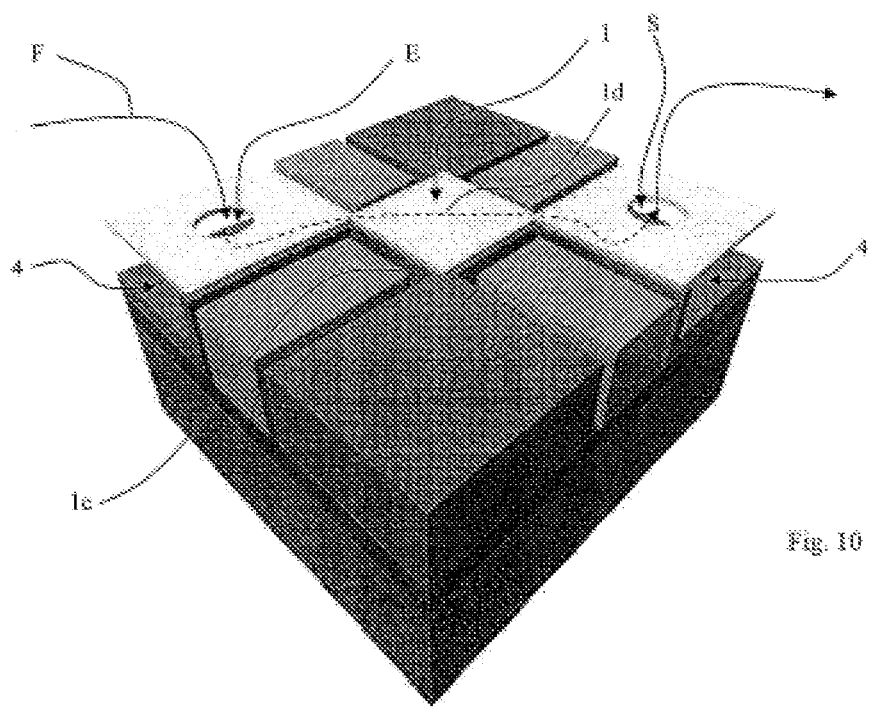
FIG. 10, a schematic perspective view of an exemplary embodiment of a device that can be functionalized according to the method of the invention.
Figure 11:
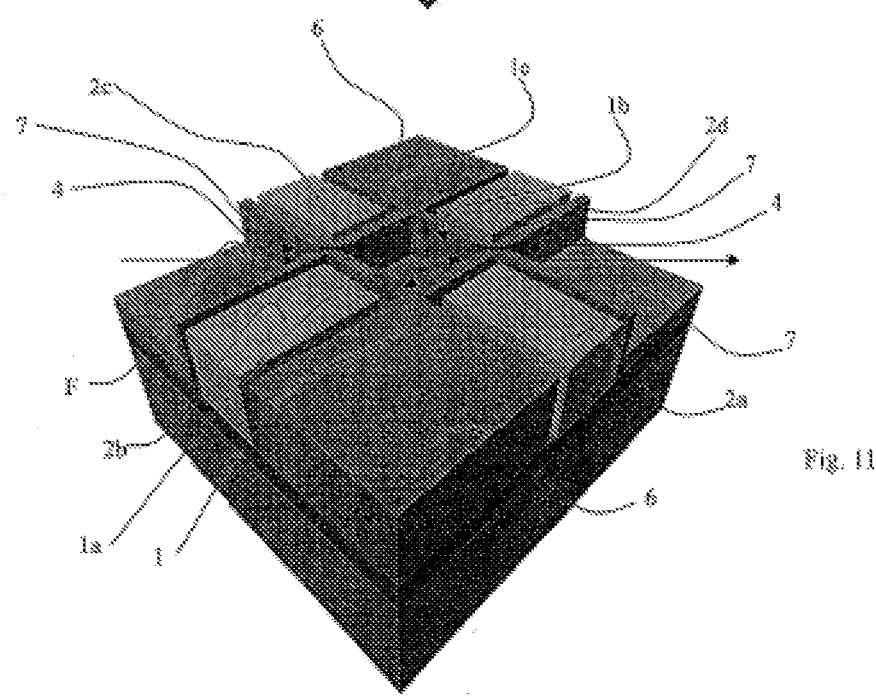
FIG. 11, a schematic perspective view showing the interior of the fluid line of the device of FIG. 10.

A device according to the invention may be a sensor allowing for gravimetric detection. Such a device is represented in FIGS. 10 and 11, and comprises a planar electromechanical oscillator 1 comprising a square bottom 1a and sides 1c defining a through cavity 1b. The oscillator 1 therefore comprises a fluid line 1b. Facing each of the sides and at a determined distance g, an electrode 2a, 2b, 2c and 2d is arranged in the same plane as the oscillator. Throughout the application, the expression "an arrangement in the same plane" should be understood to mean the fact that the electrodes are facing the sides of the oscillator, parallel to its bottom and substantially of the same thickness. Also, the distance g should be as small as possible, its value being limited mainly by the resolution of the lithography tools and by the thickness $T_{SQ}$ of the plate 1 in which the oscillator 1 is etched (typically g is of the order of $T_{SQ}/30$ and greater than 100 nm).

Figure 12:
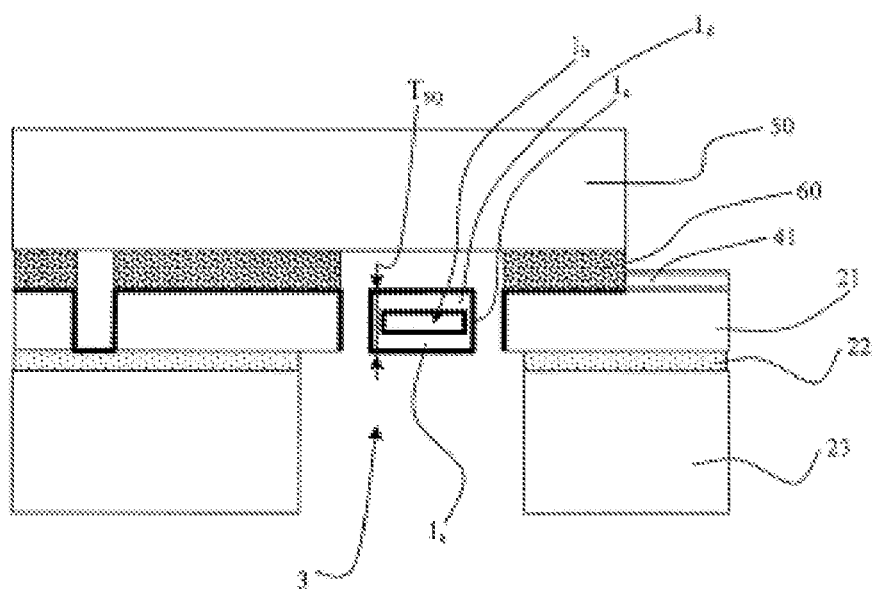
FIG. 12, a schematic cross-sectional view of an exemplary embodiment of a device according to the invention.

Referring to FIG. 12, the wall 1d is illustrated opposite the bottom 1a. The walls 1a, 1c and 1d as a whole constitute the peripheral wall 5 of the fluid line 1b. The wall 1d at least partially comprises a silicon 5a, and has, at least locally, a thickness of between 100 and 200 nm exclusive, advantageously between 160 and 180 nm.

Furthermore, the oscillator 1 is supported by support means above an aperture 3a (see FIG. 12) so that it can vibrate, preferably at its resonance frequency (according to a lamé or volume extension mode for example), substantially in its plane, by electrostatic coupling via lateral electrodes. By doing this, the gravimetric detector according to the invention exhibits a high quality coefficient since the volume of fluid displaced is located inside the fluid line of the oscillator.

The device also comprises a channel 4 for the passage of a fluid arranged to be fluidically connected to the through cavity 1b of the oscillator 1. Thus, as illustrated by the arrow F in FIG. 10, the fluid enters into the device through a fluid inlet E, passes through the cavity 1b of the oscillator 1 then emerges from the device via the fluid outlet S.

Thus, the fluid analyzed by the device is insulated in a leaktight manner from the environment in which the oscillator is actuated and which is, preferably, a dry medium.

According to a preferred embodiment, the planar electromechanical oscillator takes the form of a plate with a width $L_{sq}$ and a thickness $T_{sq}$ such that the ratio $L_{sq}/T_{sq}$ of the width to the overall thickness of the oscillator is between 10 and 30, preferably 30. In this way, the plate exhibits a vibratory behavior that is different than a membrane.

In a preferred embodiment, the support means are distributed at the four vertices of the oscillator. They may take the form of solid parts such as blocks 6 and pairs of arms 7, as illustrated in FIG. 11. In this figure, it can be seen that the two parts 6 and respectively the two pairs of arms 7 are in the extension of the diagonals of the oscillator 1. Said pairs of arms are machined so as to allow the circulation of fluid within the through cavity 1b passing through the oscillator 1.

The actuation means are implemented and arranged relative to the oscillator so that the latter can vibrate, in its plane, according to a determined vibration mode. Depending on the manner in which the actuation means are activated, the oscillator may vibrate according to different modes, such as the lame mode, the volume extension mode or, according to the so-called "wine glass" mode (particularly for a circular or annular oscillator).

The oscillator 1 can be made to vibrate, in its plane, by electrostatic coupling, via at least one of the four electrodes 2a to 2d, or, in a preferred embodiment, two adjacent electrodes.

Other actuation means can however be incorporated on the oscillator 1. By structuring, for example, a layer of piezoelectric nature (aluminum nitride or PZT for example) on the external surface of the top wall 1d of the oscillator, it is possible to produce a piezoelectric actuation.

In the same way, the detection of the vibration amplitudes of the oscillator can be done by capacitive coupling via at least one of the four electrodes 2a to 2d, or, in a preferred embodiment, via two adjacent electrodes. Other detection means can be envisaged such as a piezoelectric, piezometallic or piezoresistive detection.

In order to miniaturize the various elements of the gravimetric detection device, it is desirable to produce them using techniques of micro- or nanostructuring of a substrate that may consist either of a layer of polysilicon deposited on a thermal oxide, or a substrate of SOI (silicon on insulator). The latter substrate consists of two layers of monocrystalline silicon between which is deposited a layer of silicon dioxide ($SiO_2$).

One of the advantages of this technology rests on the fact that it is less subject to mechanical dissipation mechanisms than that of polycrystalline materials (for example polysilicon) in which grain joint relaxation phenomena are often observed.

The production of a gravimetric detection device according to the invention comprises, generally, the following steps:

the selection of a substrate that is appropriate for the gravimetric detection envisaged, comprising, at least partially, a layer of silicon, the production from said substrate of an electromechanical oscillator that is planar and at least partially comprises a layer of silicon, the production of a through cavity in said oscillator, such that the wall of the oscillator at least partially comprising the layer of silicon has, at least locally, a thickness e of between 100 and 200 nm exclusive, preferably between 160 and 180 nm, the production of a channel for the passage of the fluid, said channel being fluidically connected to said fluid line formed in the oscillator, the silanization of at least the internal surface of the fluid line.

An exemplary embodiment of a device is illustrated in cross section in FIG. 12, in transversal cross section.

The device comprises an oscillator 1 of overall thickness $T_{SQ}$, between two cavities 3a and 3b. The cavity 3b is defined between the oscillator 1, a transparent cap 50 (preferably made of glass or Pyrex) or a cap support layer 60 (made of biocompatible polymer or highly resistive silicon). The device may also comprise a layer 71 of metal to form electrodes (see FIG. 14). The portion of the wall 1a and/or 1d has, at least locally, a thickness e of between 100 and 200 nm exclusive, preferably between 160 and 180 nm. These walls comprise a layer 5a of silicon derived from the layer 21 (or 31: see FIG. 14) of the SOI substrate used during the fabrication of the device. An example of fabrication is given in the document FR 2 931 549.

The benefit of providing walls 1a and 1d that have a thickness of between 100 and 200 nm exclusive, preferably between 160 and 180 nm, lies in the possibility of functionalizing the internal face of the oscillator after the fabrication of the device, and not necessarily during this fabrication as suggested in the document FR 2 931 549. The invention therefore makes it possible to propose oscillators made of silicon that can be functionalized subsequently according to the requirements.

Figure 13:
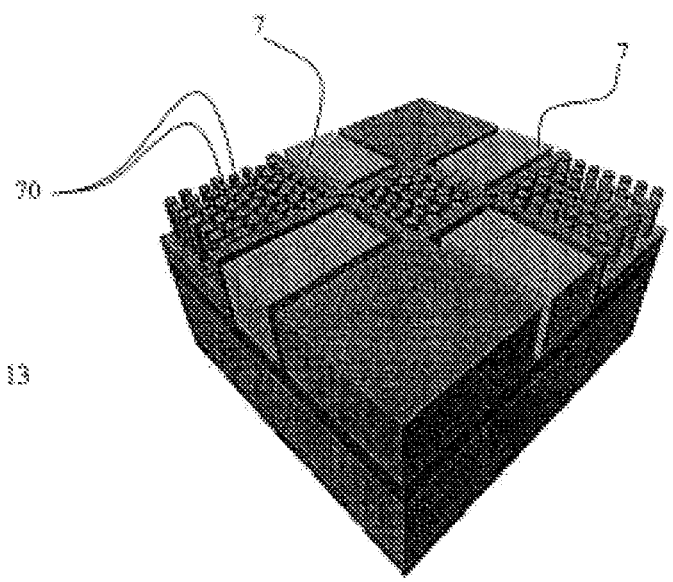
FIG. 13, a schematic perspective view of a device similar to that of FIGS. 10 and 11.

As illustrated in FIG. 13, pillars can be arranged upstream and/or downstream of the cavity 1b machined in the oscillator (that is to say before and/or after the passage of the arms 7 indicated in FIG. 13). Upstream of the oscillator, they can be used to capture the molecules which are not of interest and which are brought via the fluid inlet E. For this, the spacing between these pillars is adjusted so as to allow the molecules of interest, and not the other molecules, to circulate from the inlet E to the outlet S. Arranging pillars downstream of the oscillator makes it possible to reverse the direction of circulation of the fluid, and thus to facilitate the use of the detection device according to the invention which does not depend on the direction of flow of the fluid.

When the pillars are incorporated in the oscillator, they serve to support and reinforce the wall 1d covering the cavity 1b formed within the oscillator.

They also serve to increase the available capture area for the grafting of the biological objects of interest, in order to increase the probability of capture and the sensitivity of the sensor. The pillars have a transversal section of circular, elliptical or polygonal form.

FIG. 14 shows a device in longitudinal cross section, similar to FIG. 12, and in which the internal face of the cavity of the oscillator has been functionalized by the method according to the invention.

This device comprises, above the functionalized wall of the oscillator, a metallic layer 71 serving as mask during the functionalization, and, advantageously, with electrical functions, such as DEP (dielectrophoresis) concentration or piezoelectric detection.

The invention claimed is:

1. A method for functionalizing a micromechanical device provided with a fluid line comprising a peripheral wall having a surface external to the line and an internal surface delimiting a space in which a fluid can circulate, the peripheral wall comprising at least partially a layer of silicon, wherein the method comprises the following steps:
    a) the provision of a device whose peripheral wall at least partially comprises a layer of silicon having, at least locally, a thickness (e) of between 100 and 200 nm exclusive,
    c) the silanization of at least the internal surface of the fluid line,
    d) the localized and selective photodeprotection on at least the internal surface of the silanized device by insolation of the peripheral wall at the point where it has a thickness (e) of between 100 and 200 nm exclusive.

2. The method as claimed in claim 1, comprising a step b) of hydration of at least the internal surface of the fluid line.

3. The method as claimed in claim 2, in which the hydration step comprises the immersion of the device in a solution based on alcohol and on metal hydroxide.

4. The method as claimed in claim 1, in which the silanization step comprises the immersion of the device in a solution containing photosensitive silane.

5. The method as claimed in claim 4, in which the silane used in the silanization step is a photosensitive oxyamine silane.

6. The method as claimed in claim 1, in which the insolation is produced by an ultraviolet lamp.

7. The method as claimed in claim 6, in which the ultraviolet lamp has a power of 100 W and an intensity of between 20 and 25 mW/cm$^2$.

8. The method as claimed in claim 1, in which the insolation in the step d) is performed sequentially.

9. The method as claimed in claim 8, in which the sequential insolation is produced with a UV light ray which passes through a mechanical aperture of adjustable width.

10. The method as claimed in claim 1, in which the insolation in the step d) is produced as a solid plate through a photolithography mask or through opaque patterns.

11. The method as claimed in claim 1, in which the insolation is produced on a device covered with a layer of patterns that are opaque to the silane irradiation wavelengths.

12. The method as claimed in claim 1, in which the insolation is produced by using a quartz photolithography mask comprising micronic patterns capable of filtering UV light.

13. The method as claimed in claim 11, in which the insolation is produced by using a photolithography mask combined with a masking of opaque patterns.

14. The method as claimed in claim 1, also comprising the following step:
   e) the grafting of at least one molecule onto at least one surface of a fluid line by the implementation of a pair of chemical functions borne by the molecule to be grafted and said at least one surface of the fluid line.

15. The method as claimed in claim 14, in which the molecules to be grafted are macromolecules, chosen from nucleic acids, lipids and/or proteins.

16. The method as claimed in claim 14, in which, in the step e), the molecules to be grafted are oligonucleotide probes.

17. The method as claimed in claim 1, also comprising a hybridation step, followed by a fluorescence-mode reading step.

18. A micromechanical device for implementing the method as claimed in claim 1, the device being provided with a fluid line comprising a peripheral wall having a surface external to the line and an internal surface delimiting a space in which a fluid can circulate, characterized in that the peripheral wall at least partially comprises a layer of silicon having, at least locally, a thickness of between 100 and 200 nm exclusive, and in that the internal surface is silanized.

19. A micromechanical device which can be obtained by the method as claimed in claim 1, in which the silanized internal surface is at least locally deprotected at the point where the thickness of the wall is between 100 and 200 nm exclusive.

20. The device as claimed in claim 19, in which the locally deprotected silanized internal surface comprises grafted molecules.

21. The device as claimed in claim 20, in which the grafted molecules are probes.

22. The device as claimed in claim 18 for the gravimetric detection of particles in a fluid medium, comprising a planar electromechanical oscillator, oscillator support means and means for actuating said oscillator, said means being arranged to ensure the vibration of the oscillator in its plane, said device also comprising a channel for the passage of the fluid, the planar electromechanical oscillator comprising a through cavity fluidically connected upstream and downstream to said channel, the line having an internal surface delimiting a space in which a fluid can circulate, and being at least partially delimited by a peripheral wall comprising a layer of silicon having, at least locally, a thickness of between 100 and 200 nm exclusive, the internal surface being silanized.

23. The device as claimed in claim 22, in which the silanized internal surface is at least locally deprotected at the point where the thickness of the wall is between 100 and 200 nm exclusive.

24. The device as claimed in claim 23, in which the locally deprotected silanized internal surface comprises grafted molecules.

25. The device as claimed in claim 24, in which the grafted molecules are probes.

26. The device as claimed in claim 22, in which the electromechanical oscillator has a form taken from a disk, a ring and a polygon, preferably a square.

27. The device as claimed in claim 26, in which the oscillator is of square form and has a width (Lsq) and a thickness (Tsq) such that the ratio of the width to the thickness (Lsq/Tsq) is between 10 and 30.

28. The device as claimed in claim 22, in which said electromechanical oscillator is obtained from a substrate made of polycrystalline material.

29. The device as claimed in claim 22, in which said electromechanical oscillator is obtained from a substrate made of monocrystalline material.

30. The device as claimed in claim 22, in which the substrate is silicon-based.

31. The device as claimed in claim 22, in which said through fluid line of the oscillator and/or the channel contains pillars whose transversal section is of a form taken from a circle, an ellipse and a polygon.

32. A method for producing a device as claimed in claim 18, comprising the following steps:
   a) the selection of a substrate that is appropriate for the gravimetric detection envisaged, comprising, at least partially, a layer of silicon,
   b) the production from said substrate of an electrically planar oscillator at least partially comprising the layer of silicon,
   c) the production of a fluid line in said oscillator, such that the portion of the wall comprising the layer of silicon has, at least locally, a thickness of between 100 and 200 nm exclusive,
   d) the production of a channel for the passage of the fluid, said channel being fluidically connected to said fluid line formed in the oscillator;
   e) the silanization of at least the internal surface of the fluid line.

* * * * *